(12) United States Patent
Camargo et al.

(10) Patent No.: US 8,493,154 B1
(45) Date of Patent: Jul. 23, 2013

(54) LINEARITY ENHANCEMENT ON CASCODE GAIN BLOCK AMPLIFIER

(75) Inventors: Edmar Camargo, San Jose, CA (US); Hyung Mo Yoo, San Jose, CA (US); Seokho Bang, San Jose, CA (US)

(73) Assignee: Berex Corporation, San Jose, CA (US)

( * ) Notice: Subject to any disclaimer, the term of this patent is extended or adjusted under 35 U.S.C. 154(b) by 0 days.

(21) Appl. No.: 13/284,722

(22) Filed: Oct. 28, 2011

(51) Int. Cl.
*H03F 3/04* (2006.01)

(52) U.S. Cl.
USPC ............................................. 330/311; 330/296

(58) Field of Classification Search
USPC ........................... 330/311, 277, 289, 285, 296
See application file for complete search history.

(56) References Cited

U.S. PATENT DOCUMENTS

| | | | |
|---|---|---|---|
| 6,392,492 B1 | 5/2002 | Yuan | |
| 7,714,664 B2 * | 5/2010 | Kanaya et al. | 330/311 |

OTHER PUBLICATIONS

Analysis and Design of Analog Integrated Circuits (John Wiley & Sons, 2001), Paul R. Gray, Paul J. Hurst, Stephen H. Lewis, Robert G. Meyer.

* cited by examiner

*Primary Examiner* — Hieu Nguyen
(74) *Attorney, Agent, or Firm* — Dorsey & Whitney LLP

(57) ABSTRACT

A cascode amplifier circuit having substantial linearity, while maintaining other advantages of cascode amplifiers such as relatively high input-to-output isolation and relatively high gain. The cascode amplifier circuit also provides substantially matched impedance between input and output, at least within a selected frequency band, with the effect of providing a circuit that is well-suited for use in a communication system. The cascode amplifier circuit includes feedback loops, such as for example DC feedback loops and AC feedback loops, and bias optimization, with the effect of improving linearity, maintaining gain, minimizing return loss, and providing a relatively high dynamic range.

18 Claims, 7 Drawing Sheets

LINEARITY ENHANCEMENT ON CASCODE GAIN BLOCK AMPLIFIER

BACKGROUND

In RF communications, interference between differing carrier frequencies is undesirable, even when the information is coded in FM or more sophisticated systems such as CDMA, which are generally more immune to interference compared to classical AM systems. For instance, when using CDMA, different carrier frequencies are often spaced closely together, which can result in leakage of signals between carriers, which can corrupt the coding contained in the carrier. The carriers should be amplified before being transmitted at the power level dictated by the communication channel. In that process, interference can arise due to the non-linearity of RF power amplifiers. Nonlinearity can result in generation of harmonics of the carrier frequencies and can cause damaging intermodulation between carriers. This is demonstrated by the amplifier output voltage expressed by equation (1), showing it is composed by an amplification of input voltage, $a_1$, plus additional (undesirable) components, $a_2$ and $a_3$. Of these additional undesirable components, the most problematic is $a_3$, which creates the so-called third order intermodulation component.

$$V_{out} = a_1 V_{in} + a_2 V_{in}^2 + a_3 V_{in}^3 + \quad (1)$$

A first value $P_{out}$ represents a desired output signal for an amplifier, proportional to the input signal by an amplification constant $a_1$, as described in equation (1) above. A second value $IMD_3$ represents an undesired signal contributed to an output of an amplifier proportional to the input signal by an third-order intermodulation component $a_3$. A linearity parameter $P_{1\,dB}$ indicates an output power level when the gain of the amplifier is reduced by 1 dB from $P_{out}$. Another linearity parameter $OIP_3$ (Output Intercept Point of $3^{rd}$ order) indicates a extrapolated intersection of the linear contribution of $P_{out}$ and the undesired contribution from $IMD_3$.

In communication systems such as WCDMA, WiMax, or LTE systems, it is desirable to have the ratio $IMD_3/P_{out}$ be as low as possible, which is directly related to the ratio $a_3/a_1$, so that the undesired signals are low enough to not affect recovery of information at the receiver. One known amplification topology used in RF communication is the cascode amplifier, in which two amplifiers are coupled in series, with the effect of having the same current circulating in each device. While these known amplification circuits generally achieve the effect of relatively high input-to-output isolation and relatively high gain, they have drawbacks, among which are inferior linearity when compared with conventional single-ended amplifiers operating at the same power supply voltage, such as about +5 volts.

Some publications which might have bearing on the known art include:
"High Linearity Cascode Low Noise Amplifier", U.S. Pat. No. 6,392,492 Bi (May 21, 2002), Xiaojuen Yuan.
ANALYSIS AND DESIGN OF ANALOG INTEGRATED CIRCUITS (John Wiley & Sons, 2001), Paul R. Gray, Paul J. Hurst, Stephen H. Lewis, Robert G. Meyer.

SUMMARY OF THE DESCRIPTION

We provide techniques for signal amplification with a cascode amplifier circuit having relatively superior linearity, while maintaining other advantages of cascode amplifiers such as relatively high input-to-output isolation and relatively high gain. In one embodiment, a cascode amplifier circuit includes feedback loops, such as for example DC feedback loops and AC feedback loops, and dynamic bias, with the effect of improving linearity, maintaining gain, minimizing return loss, and providing a relatively high dynamic range. In one embodiment, the cascode amplifier circuit operates over the frequency band of about 0.1 GHz to about 4 GHz, with a maximum noise figure of about 2 dB. In such embodiments, a cascode amplifier circuit substantially improves $OIP_3$ better than about 15 dB above $P_{1\,dB}$, that is, a improvement of at least about 5 dB compared to conventional amplifiers.

DESCRIPTION

Generality of the References

Figure 1:
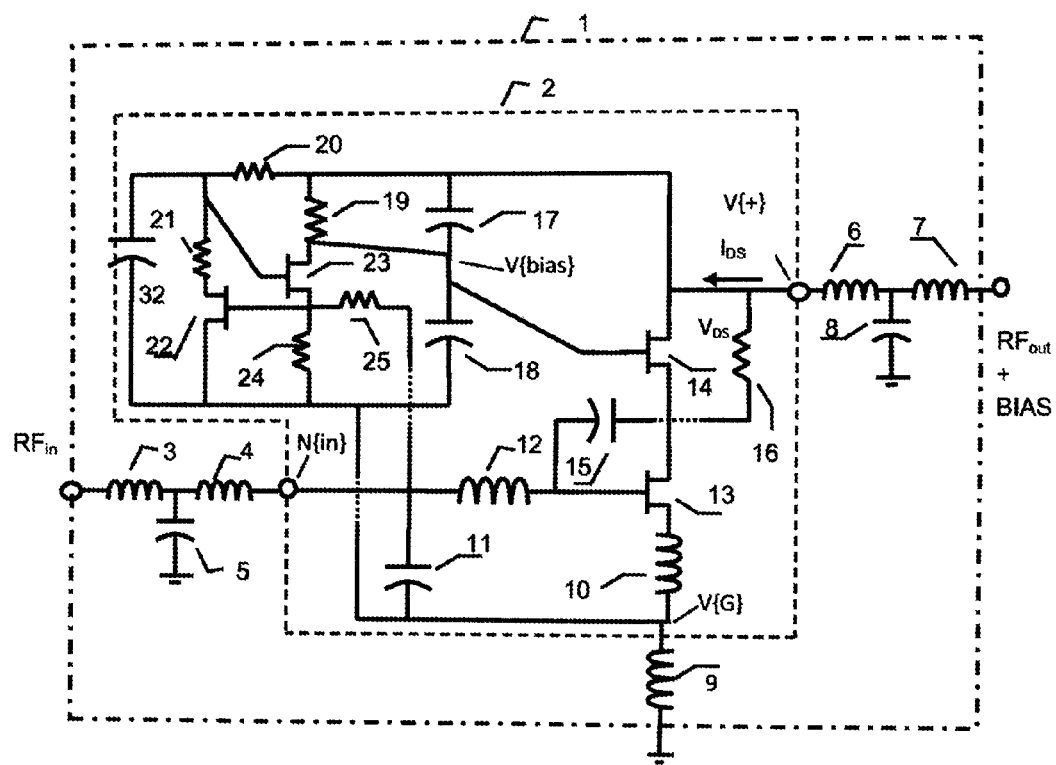
FIG. 1 shows a circuit, having elements shown in the figure.

This application should be read in the most general possible form. This includes, without limitation, the following:

References to contemplated causes and effects for some implementations do not preclude other causes or effects that might occur in other implementations.

References to one embodiment or to particular embodiments do not preclude alternative embodiments or other embodiments, even if completely contrary, where circumstances would indicate that such alternative embodiments or other embodiments would also be workable.

References to particular reasons or to particular techniques do not preclude other reasons or techniques, even if completely contrary, where circumstances would indicate that the stated reasons or techniques are not as applicable.

References to "preferred" techniques generally mean that the inventors contemplate using those techniques, and think they are best for the intended application. This does not exclude other techniques for the invention, and does not mean that those techniques are necessarily essential or would be preferred in all circumstances.

References to specific techniques include alternative and more general techniques, especially when discussing aspects of the invention, or how the invention might be made or used.

Generality of the Techniques

Technologies shown or suggested by this description should also be thought of in their most general possible form. This includes, without limitation, the following:

The phrases and terms "constantly," "continually," "from time to time," "occasionally," "periodically" (and similar phrases and terms) generally indicate any case in which a method or technique, or an apparatus or system, operates over a duration of time, including without limitation any case in which that operation occurs only part of that duration of time. For example and without limitation, these terms would include, without limitation, methods which perform an operation as frequently as feasible, on a periodic schedule such as once per second or once per day, in response to an alarm or trigger such as a value reaching a threshold, in response to a request or an implication of a request, in response to operator intervention, otherwise, and to combinations and conjunctions thereof.

The phrases and terms "methods, physical articles, and systems," "techniques" (and similar phrases and terms) generally indicate any material suitable for description, including without limitation all such material within the scope of patentable subject matter, or having ever been considered within the scope of patentable subject matter, or which might colorably be within the scope of patentable subject matter, notwithstanding most recent precedent.

The term "relatively" (and similar phrases and terms) generally indicates any relationship in which a comparison is possible, including without limitation "relatively less," "relatively more," and the like. In the context of the invention, where a measure or value is indicated to have a relationship "relatively," that relationship need not be precise, need not be well-defined, need not be by comparison with any particular or specific other measure or value. For example and without limitation, in cases in which a measure or value is "relatively increased" or "relatively more," that comparison need not be with respect to any known measure or value, but might be with respect to a measure or value held by that measurement or value at another place or time.

The term "substantially" (and similar phrases and terms) generally indicates any case or circumstance in which a determination, measure, value, or otherwise, is equal, equivalent, nearly equal, nearly equivalent, or approximately, what the measure or value is recited. The terms "substantially all" and "substantially none" (and similar phrases and terms) generally indicate any case or circumstance in which all but a relatively minor amount or number (for "substantially all") or none but a relatively minor amount or number (for "substantially none") have the stated property. The terms "substantial effect" (and similar phrases and terms) generally indicate any case or circumstance in which an effect might be detected or determined.

The phrases "this application," "this description" (and similar phrases and terms) generally indicate any material shown or suggested by any portions of this application, individually or collectively, including all documents incorporated by reference or to which a claim of priority can be made or is made, and include all reasonable conclusions that might be drawn by those skilled in the art when this application is reviewed, even if those conclusions would not have been apparent at the time this application is originally filed.

The invention is not in any way limited to the specifics of any particular examples disclosed herein. After reading this application, many other variations are possible which remain within the content, scope and spirit of the invention; these variations would be clear to those skilled in the art, without undue experiment or new invention.

FIGURES AND TEXT

FIG. 1

FIG. 1 shows a circuit, having elements shown in the figure, including at least a packaging element 1 (such as for example a plastic or ceramic package) enclosing an IC die 2 (such as for example a substantially monolithic GaAs semiconductor die). In one embodiment, the circuit uses E-PHEMT (enhancement gallium arsenide pseudo-morphic high electron mobility) technologies. However, while this Application primarily describes a circuit using E-PHEMT technology, in the context of the invention, there is no reason for any such limitation. For example, the circuit could also work with any other E type technology FET, such as for example E-MESFET and NMOS technologies. As shown below, the circuit provides substantially improved dynamic range for linearity.

An input signal $RF_{in}$ is coupled to the package 1 at a package input element (such as for example a first conductive package terminal), represented in the figure as a series parasitic inductance L3 coupled to a parallel parasitic capacitance C5. The die 2 is attached to the package input element using wire bonds, represented in the figure as a series parasitic inductance L4 and coupled to a node N in at the die 2. Similarly, an output signal $RF_{out}$ is coupled to the package 1 at a package output element (such as for example a second conductive package terminal), represented in the figure as a series parasitic inductance L7 coupled to a parallel parasitic capacitance C8. The die 2 is attached to the package output element using wire bonds, represented in the figure as a series parasitic inductance L6 and coupled to a node $N_{out}$ at the die 2. The output is also coupled to a voltage $V_+$, whose DC component is substantially larger than either the (time-varying) input signal $RF_{in}$ and the output signal voltage swings around the DC component, and has the effect of providing power for amplification by the circuit.

A cascode amplifier includes a first transistor M13 and a second transistor M14, with a drain of the first transistor M13 is coupled to a source of the second transistor M14, with the effect that first and second transistors M13 and M14 share a drain current.

The DC voltage $V_+$ is coupled to a source for the second transistor M14, whose terminal also contains an amplified replica of the input signal $RF_{in}$. After reading this application, those skilled in the art will realize that there is a time-varying signal at input, $RF_{in}$, along with an input DC component, a substantially higher time-varying signal at output, $RF_{out}$, with an output DC component, plus distortion signals generated by the device as described above with respect to equation (1). The input signal $RF_{in}$ is not substantially affected by the output signal $RF_{out}$.

After reading this Application, those skilled in the art would recognize that the DC voltage available for amplifier power remains relatively constant despite the time-varying component of the input signal $RF_{in}$, and the DC current available for amplifier power remains relatively constant so long as the maximum DC power made available to the amplifier is below the $P_{1\ dB}$ point by at least about 10 dB.

A feedback inductor L9 is coupled in series between a grounding element and a node $V_G$, the latter having a voltage substantially equal to the grounding element. This has the effect of providing substantial impedance matching, with relatively minimal sacrifice in amplifier gain at relatively high frequencies. The node $N_{in}$ is coupled in parallel to a capacitor C11, which is coupled to the node $V_G$, and in series to an inductor L12, which is coupled to a gate of the first transistor M13. This has the effect of matching the gate impedance of the first transistor M13 to an industry-standard 50 ohm impedance value.

A source of the first transistor M13 is coupled to an inductor L10, which is also coupled to the node $V_G$. The voltage $V_+$ is also coupled to the gate of transistor M13 by a branch including capacitor C15 in series with resistor R16, with the effect of providing RF feedback from output drain of transistor M14 to the input gate of transistor M13. After reading this application, those skilled in the art would recognize that impedance at the device terminals would be better matched due to feedback action, with the effect of better linearity in amplification.

The node is coupled in series to a first capacitor C17, which is coupled to a node $V_{bias}$, which is coupled to a second capacitor C18, which is coupled to the node $V_G$. The node $V_{bias}$ is coupled to a gate of the second transistor M14, with the effect of biasing the second transistor M14. After reading this application, those skilled in the art will realize that the capacitors C17 and C18 form a capacitive RF voltage divider, which provides a second feedback action from the output to the gate of the second transistor M14 in response to the input signal $RF_{in}$.

The node $V_+$ is also coupled in series to a resistor R19, which is coupled to the drain of transistor M23. The source of transistor M23 is coupled to the resistor R24 which is connected to node $V_G$. The bias of transistor M23 is determined by the resistive divider composed of resistors R20 and R21, which selects a fraction of the voltage difference between the node and the node $V_G$ to be coupled to the gate of transistor M23. The drain current of transistor M23 develops a voltage on resistor R19, which determines the DC voltage of node Vbias and the bias for transistor M14.

A transistor M23 has its drain coupled to the node $V_{bias}$, its gate coupled to the node $V_a$, and its source coupled to the gate of a transistor M22. The transistor M22 has its source coupled to the node $V_G$, and its drain coupled in series to a resistor R21, which is coupled to the gate of the transistor M23. The gate of transistor M22 and the source of transistor M23 are coupled in parallel to a resistor R24, which is coupled to $V_G$, and to a resistor R25, which is coupled to $N_{in}$. This has a first effect of biasing of the gate of the transistor M13 provided by the DC voltage generated by the current flowing through the resistor R24 and the node $V_G$. This also has a second effect that the resistor R24 and the resistor R25 collectively form a voltage divider, which selects a fraction of the voltage difference between the node $V_G$ and the gate of the transistor M13, to be coupled to the gate of transistor M22.

After reading this application, those skilled in the art would realize that the transistor M22 and the transistor M23 collectively provide a response to variations in the time-varying input signal $RF_{in}$. As the input signal $RF_{in}$ varies, about the $P_{1\,dB}$ power level, the voltage at the gate of the transistor M22 (and at what is the same node, the source of the transistor M23), also varies in response to the input signal $RF_{in}$. This has the effect that the bias voltage applied to the first transistor M13 is varied in response the input signal $RF_{in}$, providing improved linearity for the cascode amplifier. A measure of this effect is shown below with respect to the FIG. 3.

The transistor M22 and the transistor M23 collectively provide a threshold voltage source, capable of stabilizing the current of M13 over temperature and $V_{threshold}$ process variations. The transistor M22 and the transistor M23 also collectively provide a peak rectifier of the input signal $RF_{in}$, which has the effect of correcting the bias voltage at the gate of the transistor M13, particularly near the $P_{1\,dB}$ power compression point, which in has the effect of correcting nonlinearities of the amplifier. The value of capacitor C32 partially controls the degree of this rectifier effect.

FIG. 2

Figure 2:
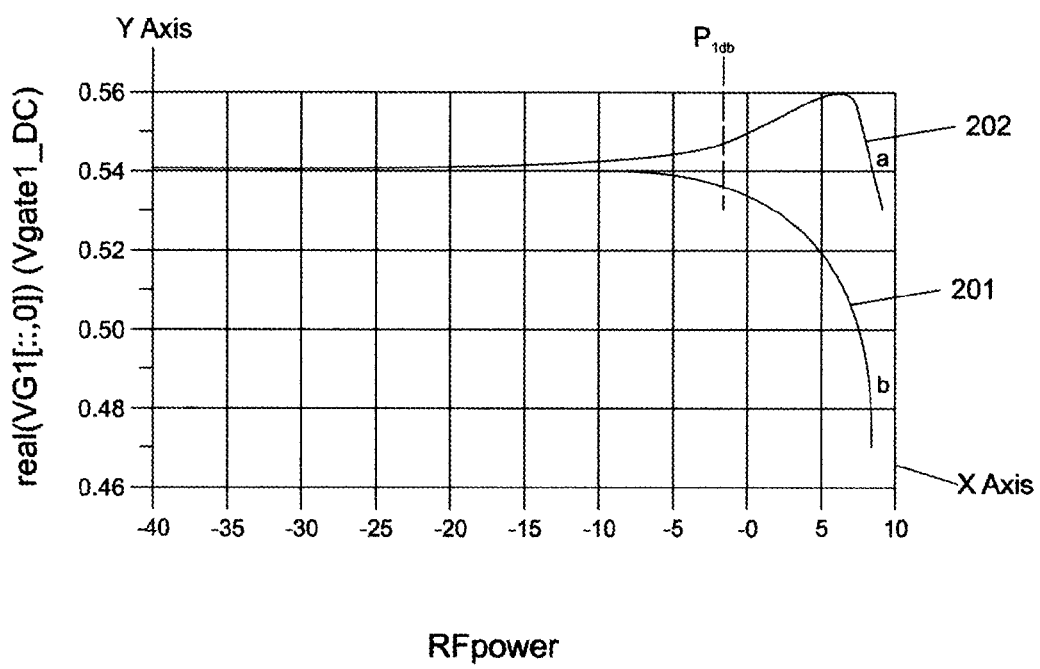
FIG. 2 shows a chart of the voltage at the gate of the transistor M13 in response to an amount of gain applied to the signal $RF_{in}$.

FIG. 2 shows a chart of the voltage at the gate (a gate bias voltage) of the transistor M13 in response to an amount of gain applied to the signal $RF_{in}$. An X axis shows an amount of RF driving power. A Y axis shows an amount of bias voltage. A first graphic 201 shows, without use of the transistor M22 and the transistor M23, a relatively sharp drop in bias voltage in response to increased RF power. A second graphic 202 shows, in one embodiment, with use of the transistor M22 and the transistor M23, a substantial bump at a relatively higher RF power, starting approximately at a $P_{1\,dB}$ point, with the effect substantially correcting any dropoff in linearity at relatively higher gain (which would provide relatively higher RF power).

Transistor M23 has a function to partially amplify the distortion voltage and to feedforward that distortion voltage from the drain of transistor M23 to the gate of transistor M14. This has the effect of improving $OIP_3$ from about 3 dB to about 6 dB. As noted above, in one embodiment, the capacitors C17 and C18 form a capacitive RF voltage divider, which allows the circuit to control signal feedback to the gate of transistor M14. This has the effect of further improving $OIP_3$ from about 4 dB to about 5 dB, providing a cumulative improvement of more than about 10 dB.

FIG. 3

Figure 3:
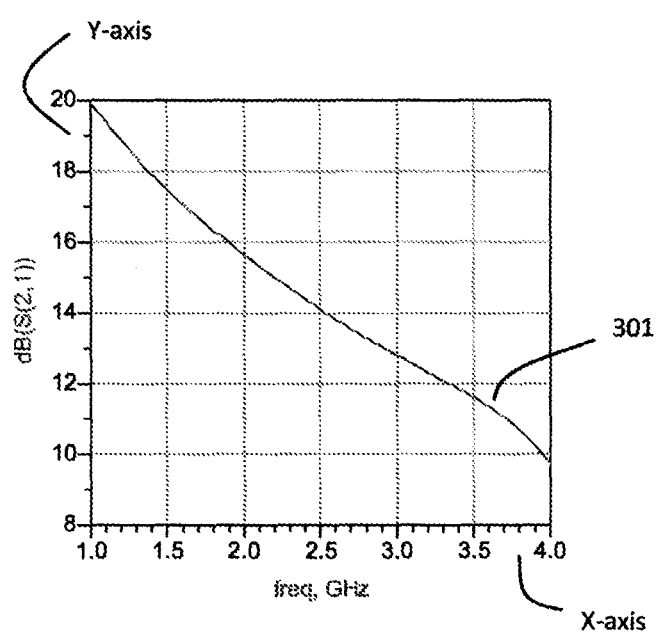
FIG. 3 shows a chart of amplifier gain in response to signal frequency of $RF_{in}$.

FIG. 3 shows a chart of amplifier gain in response to signal frequency of $RF_{in}$. An X axis shows an input signal frequency. A Y axis shows an amplifier gain. A graphic 301 shows, in one embodiment, a relationship between amplifier gain in response to input signal frequency, showing a minimum gain of 10 dB at the high of frequency band and 20 dB at the low end of the band, with the relative effect of use in several communication bands.

FIG. 4

Figure 4:
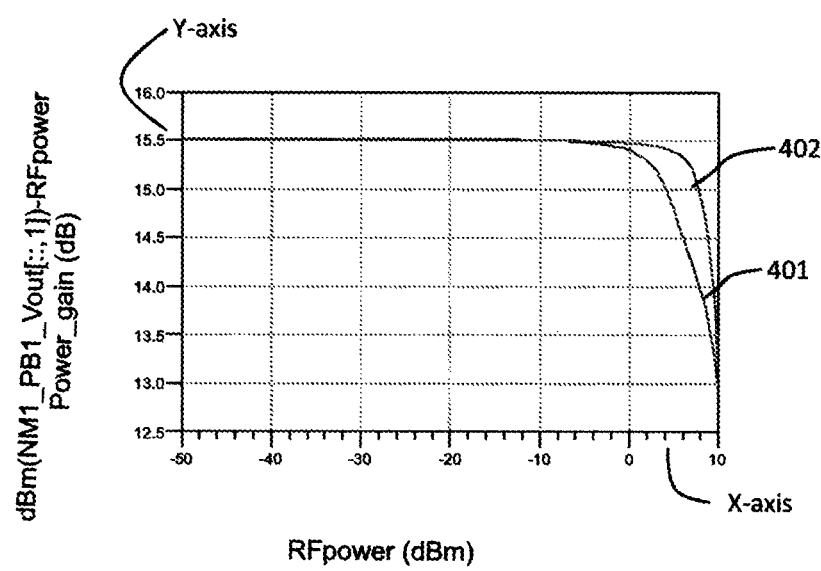
FIG. 4 shows a chart of an amplifier performance in response to an amount of RF driving power.

FIG. 4 shows a chart of an amplifier performance in response to an amount of RF driving power. An X axis shows an amount of RF driving power, in dBm (that is, from $10^{-5}$ milliwatts to $10^1$ milliwatts). A Y axis shows an amplifier performance gain, in dB (that is, a gain of between $10^{1.25}$ and $10^{1.60}$). A first graphic 401 shows, using a conventional cascade amplifier, a relatively sharp drop in amplifier performance from about 15.5 dB, starting at an X axis value between about −10 dBm. A second graphic 402 shows, using the circuit shown with respect to an embodiment of the invention, a significantly better amplifier performance, again with the effect of relative superiority for use in communication systems.

An embodiment of the invention is able to achieve a 22 dBm output power at the $P_{1\,dB}$ compression point. Thus, the second graphic 402 crosses the Y value at 14.5 dB, that is, a 1.0 dB reduction from the ordinary amplifier gain of 15.5 dB, when the X value is about 9.0 dBm, for a total exceeding 22 dBm. Even so, the value of $OIP_3$ is above 45 dBm. Thus, the value of $IMD_3$ rises very slowly with respect to the amplifier output $P_{out}$. This is more than 20 dB improvement over a conventional amplifier, while still operating over a relatively broadband selection of frequencies. The inventors have found that an embodiment of the invention operates with approximately this degree of improvement between about 0.1 GHz to 4.0 GHz.

FIGS. 5-6

Figure 5:
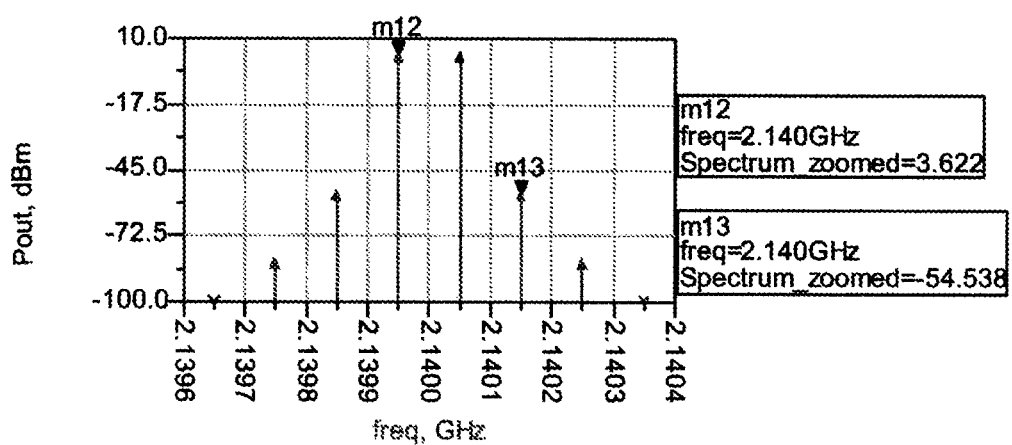
FIGS. 5-6 show charts comparing a third order intermodulation component for a conventional cascode amplifier with an embodiment of the invention.
Figure 6:
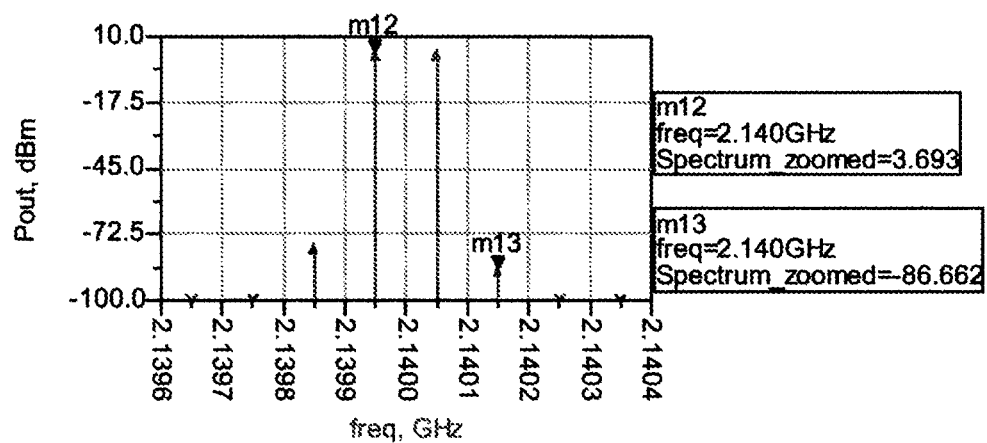

FIGS. 5-6 show charts comparing a third order intermodulation component for a conventional cascode amplifier (FIG. 5) with an embodiment of the invention (FIG. 6). A third order intermodulation component (m13) in a conventional cascode amplifier (FIG. 6) is significantly closer to the amplifier output (m12), than the third order intermodulation component (m13) is to the amplifier output (m12) in an embodiment of the invention (FIG. 6).

FIG. 7

Figure 7:
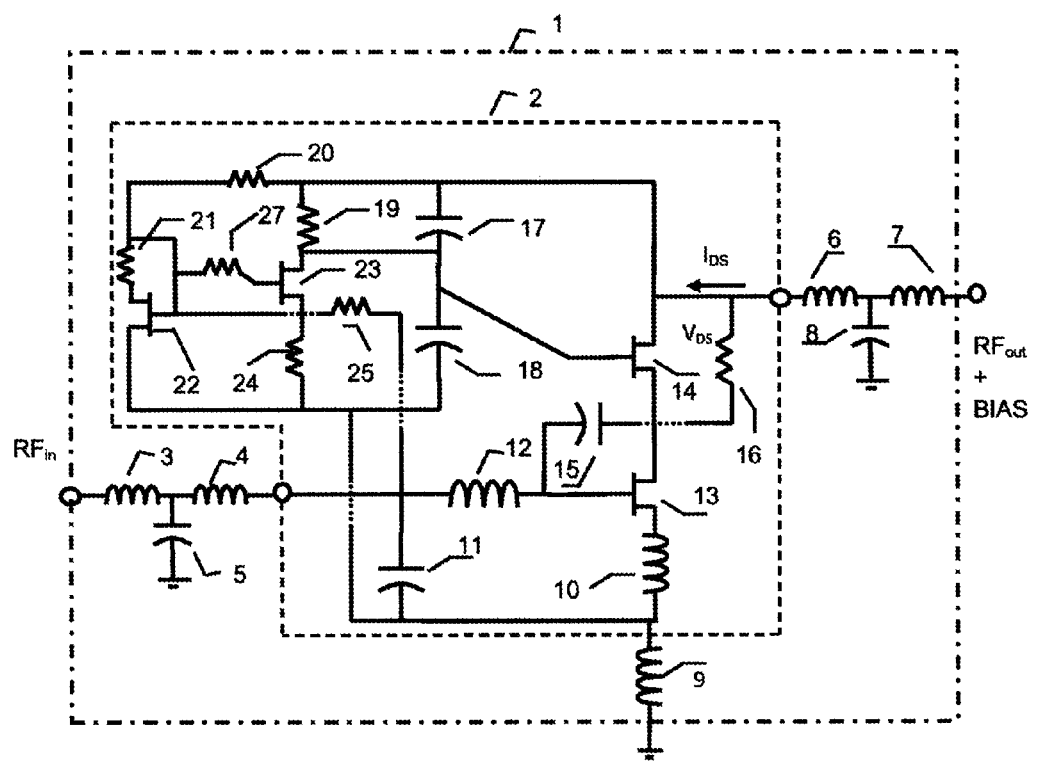
FIG. 7 shows a second embodiment of a circuit, having elements shown in the figure.

FIG. 7 shows a second embodiment of a circuit, having elements shown in the figure, similar to elements as shown in the FIG. 1.

The circuit includes a similar packaging element 1, IC die 2, node $N_{in}$, output signal $RF_{out}$, node $N_{out}$, voltage $V_+$, node $V_G$, node $V_{bias}$, and circuit components including at least inductor L9, inductor L10, capacitor C11, inductor L12, transistor M13, transistor M14, capacitor C15, resistor R16, capacitor C17, capacitor C18, resistor R19, resistor R20, resistor R21, transistor M22, transistor M23, resistor R24, and resistor R25.

In this second embodiment of a circuit, the transistor M22 has an effect of being a current mirror, controlling the current of transistors M13 and M14, rather than allowing them to vary in response to temperature variations and process variations. Similar to the first embodiment of the circuit, the transistor M22 also has the effect of a rectifier of the RF peak voltage (which would otherwise generate distortion), and has the effect of correcting the DC voltage at transistor M13. The DC voltage and distortion voltage are also applied to the transistor M23, with the effect of applying them to the gate of the transistor M14.

Alternative Embodiments

The invention has applicability and generality to other aspects of amplifier devices and communication systems, including power or driver amplifiers for communication systems operating in WCDMA, WiMax and LTE communication systems.

The invention claimed is:

1. Apparatus including
a cascode amplifier having a lower and a upper transistor,
said lower transistor having a gate coupled to an input signal, said input signal capable of being amplified, said upper transistor having a source coupled directly to a drain of said lower transistor, and said upper transistor having a drain coupled to an amplification power node and to an amplified output signal;
said upper transistor having a gate coupled to a bias node, said bias node coupled to a feedback circuit including a plurality of capacitors in series, said bias node also coupled to a voltage divider including a plurality of resistors in series, said feedback circuit and said voltage divider coupled between said amplification power node and a grounding voltage;
said lower transistor gate coupled to a bias circuit, said bias circuit being responsive to said input signal, said lower transistor gate being biased in response to said input signal, said bias circuit disposed to rectify a peak voltage of said input signal;
wherein
said feedback circuit couples signals from the drain of said upper transistor to the gate of said upper transistor;
said voltage divider decreases a bias voltage for said upper transistor gate in response to an increase in said input signal; and
said bias circuit decreases a bias voltage for said lower transistor gate in response to a decrease in said input signal.

2. Apparatus as in claim 1, wherein
said lower transistor gate is biased in response to said input signal near a $P_{1\,dB}$ point.

3. Apparatus as in claim 1, wherein
said cascode amplifier provides, in response to an effect of said feedback circuit and an effect of said bias circuit, a gain increase at substantially about a $P_{1\,dB}$ point for said amplifier.

4. Apparatus as in claim 3, wherein
said gain increase provides a substantially linear amplification for said amplifier, up to about said $P_{1\,dB}$ point.

5. Apparatus as in claim 1, wherein
said bias circuit provides a threshold voltage source for said cascode amplifier, said threshold voltage source having substantially low sensitivity to temperature variations.

6. Apparatus as in claim 1, wherein
said bias circuit provides a threshold voltage source for said cascode amplifier, said threshold voltage source having substantially low sensitivity to process variations.

7. Apparatus including
a cascode amplifier having a lower and a upper transistor,
said lower transistor having a gate coupled to an input signal, said input signal capable of being amplified, said upper transistor having a source coupled directly to a drain of said lower transistor, and said upper transistor having a drain coupled to an amplification power node and to an amplified output signal;
said upper transistor having a gate coupled to a bias node, said bias node coupled to a feedback circuit including a plurality of capacitors in series, said bias node also coupled to a voltage divider including a plurality of resistors in series, said feedback circuit and said voltage divider coupled between said amplification power node and a grounding voltage;
said lower transistor gate coupled to a bias circuit, said bias circuit being responsive to said input signal, said lower transistor gate being biased in response to said input signal, said bias circuit disposed to rectify a peak voltage of said input signal;
wherein
said bias circuit includes a first and a second transistor, said first transistor having a gate and said second transistor having a source, said first transistor gate coupled directly to said second transistor source at a rectifier node, said rectifier node being coupled to said input signal.

8. Apparatus as in claim 7, wherein
said first transistor gate is coupled to a voltage divider between a grounding value and a bias value for said lower transistor; and
said voltage divider includes a plurality of resistors in series and an internal rectifier node, said internal rectifier node being coupled directly to said first transistor gate.

9. Apparatus as in claim 7, wherein
said first transistor gate is coupled to a rectifier voltage divider between a grounding value and said input signal; and
said voltage divider includes a plurality of resistors in series and an internal rectifier node, said internal rectifier node being coupled directly to said first transistor gate.

10. Apparatus as in claim 7, wherein
said first transistor having a source and said second transistor having a gate, said first transistor source coupled in series with a resistor to said second transistor gate.

11. Apparatus as in claim 7, wherein
said input signal is coupled to a voltage divider including a plurality of resistors in series;
a rectifier node is coupled directly through an internal node of said voltage divider; and
said rectifier node is coupled directly to said first transistor source and said second transistor gate.

12. Apparatus as in claim 7, wherein
said second transistor having a gate, said second transistor gate being coupled in series with a capacitor to a grounding value.

13. Apparatus as in claim 12, wherein
said cascode amplifier provides a gain increase at about a $P_{1\,dB}$ point for said amplifier;

said gain increase provides a substantially linear amplification for said amplifier, at about said $P_{1\ dB}$ point;
said gain increase is responsive to a value of said capacitor coupled in series with said second transistor gate.

14. Apparatus as in claim 7, wherein
said lower transistor gate is biased in response to said input signal near a $P_{1\ db}$ point.

15. Apparatus as in claim 7, wherein
said cascode amplifier provides, in response to an effect of said feedback circuit and an effect of said bias circuit, a gain increase at substantially about a $P_{1\ dB}$ point for said amplifier.

16. Apparatus as in claim 15, wherein
said gain increase provides a substantially linear amplification for said amplifier, up to about said $P_{1\ dB}$ point.

17. Apparatus as in claim 7, wherein
said bias circuit provides a threshold voltage source for said cascode amplifier, said threshold voltage source having substantially low sensitivity to temperature variations.

18. Apparatus as in claim 7, wherein
said bias circuit provides a threshold voltage source for said cascode amplifier, said threshold voltage source having substantially low sensitivity to process variations.

* * * * *